(12) United States Patent
Matsubara (10) Patent No.: US 8,072,661 B2
(45) Date of Patent: Dec. 6, 2011

(54) COMPUTER GENERATED HOLOGRAM, EXPOSURE APPARATUS, AND DEVICE FABRICATION METHOD

(75) Inventor: Isao Matsubara, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 578 days.

(21) Appl. No.: 12/180,605

(22) Filed: Jul. 28, 2008

(65) Prior Publication Data

US 2009/0034036 A1 Feb. 5, 2009

(30) Foreign Application Priority Data

Jul. 31, 2007 (JP) ................................ 2007-199904

(51) Int. Cl.
*G02B 5/32* (2006.01)
*G03B 27/54* (2006.01)

(52) U.S. Cl. ............................... 359/15; 355/67
(58) Field of Classification Search .............. 359/9, 15; 355/53, 67, 71

See application file for complete search history.

(56) References Cited

U.S. PATENT DOCUMENTS

| 7,265,816 | B2 | 9/2007 | Tsuji | |
|---|---|---|---|---|
| 2002/0176166 | A1 * | 11/2002 | Schuster | ........................ 359/494 |
| 2006/0028957 | A1 | 2/2006 | Kim | |

FOREIGN PATENT DOCUMENTS

| EP | 1610181 A2 | 12/2005 |
|---|---|---|
| JP | 2004-198348 A | 7/2004 |
| JP | 2006-005319 A | 1/2006 |
| JP | 2006-049902 A | 2/2006 |
| JP | 2006-196715 A | 7/2006 |
| KR | 10-2006-0012515 A | 2/2006 |

OTHER PUBLICATIONS

Office Action issued in corresponding Korean Patent Application No. 10-2008-0074839 dated May 19, 2010.
European Search Report issued on Jan. 26, 2009 for European Patent Application No. 08159814.
J. Hoβfeld et al., Polarizing computer-generated holograms, *Optical Engineering*, Aug. 1993, pp. 1835-1837, vol. 32, No. 8.
F. Xu et al., Polarization-selective computer-generated holograms: design, fabrication, and applications, *Applied Optics*, Jan. 10, 1995, pp. 256-266, vol. 34, No. 2.
W. Yu et al., Polarization-multiplexed diffractive optical elements fabricated by subwavelength structures, *Applied Optics*, Jan. 1, 2002, pp. 96-100, vol. 41, No. 1.
S. Tao et al., Optimized polarization-selective computer-generated hologram with fewer phase combinations, *Optics Express*, Jun. 2, 2003, pp. 1252-1257, vol. 11, No. 11.

* cited by examiner

*Primary Examiner* — Alessandro Amari
(74) *Attorney, Agent, or Firm* — Rossi, Kimms & McDowell LLP

(57) ABSTRACT

The present invention provides a computer generated hologram which forms a light intensity distribution on a predetermined plane by giving a phase distribution to a wavefront of incident light, comprising an anisotropic layer whose refractive index with respect to linearly polarized light in a first direction is different from a refractive index of the anisotropic layer with respect to linearly polarized light in a second direction perpendicular to the linearly polarized light in the first direction, and an isotropic layer whose refractive index with respect to the linearly polarized light in the first direction is equal to a refractive index of the isotropic layer with respect to the linearly polarized light in the second direction.

13 Claims, 9 Drawing Sheets

COMPUTER GENERATED HOLOGRAM, EXPOSURE APPARATUS, AND DEVICE FABRICATION METHOD

BACKGROUND OF THE INVENTION

1. Field of the Invention

The present invention relates to a computer generated hologram, an exposure apparatus, and a device fabrication method.

2. Description of the Related Art

A projection exposure apparatus has conventionally been employed to fabricate, for example, a micropatterned semiconductor device such as a semiconductor memory or logic circuit by using photolithography. The projection exposure apparatus projects and transfers a circuit pattern formed on a reticle (mask) onto, for example, a wafer via a projection optical system.

A resolution R of the projection exposure apparatus is given by:

$$R = k_1 \times (\lambda/NA) \quad (1)$$

where λ is the exposure light wavelength, NA is the numerical aperture of the projection optical system, and $k_1$ is a process constant determined by, for example, a development process.

The shorter the exposure light wavelength or the higher the NA of the projection optical system, the better the resolution. However, it is difficult to further shorten the current exposure light wavelength because the transmittance of a glass material decreases as the exposure light wavelength shortens. It is also difficult to increase the NA of the projection optical system because the depth of focus decreases in inverse proportion to the NA of the projection optical system, and because it is hard to design and manufacture lenses to form a high-NA projection optical system.

Under the circumstances, there have been proposed resolution enhanced technologies (RETs) of improving the resolution by decreasing the process constant $k_1$. One of these RETs is the so-called modified illumination method (or oblique illumination method).

The modified illumination method generally inserts an aperture stop, which has a light-shielding plate on the optical axis of an optical system, in the vicinity of the exit surface of an optical integrator which forms a uniform surface light source, thereby obliquely irradiating a reticle with exposure light. The modified illumination method includes, for example, an annular illumination method and quadrupole illumination method that are different in the aperture shape of an aperture stop (i.e., the shape of the light intensity distribution). There has also been proposed another modified illumination method which uses a computer generated hologram (CGH) in place of an aperture stop, in order to improve the use efficiency (illumination efficiency) of exposure light.

Along with an increase in the NA of the projection optical system, a polarized illumination method which controls the polarization state of exposure light is also becoming necessary to increase the resolution of the projection exposure apparatus. The polarized illumination method basically illuminates a reticle with not P-polarized light but S-polarized light alone, which has a concentric component with respect to the optical axis.

In recent years, there has been proposed a technique which attains both the modified illumination method (the formation of a light intensity distribution having a desired shape (e.g., a quadrupolar shape)) and the polarized illumination method (polarization state control).

For example, Japanese Patent Laid-Open No. 2006-196715 discloses a technique which attains both the modified illumination method and polarized illumination method using one element. Japanese Patent Laid-Open No. 2006-196715 controls the shape (reconstructed image) of the light intensity distribution using a CGH, and controls the polarization state using structural birefringence. More specifically, this technique forms one CGH by parallelly arranging a plurality of CGHs (to be referred to as "sub-CGHs" hereinafter) corresponding to light beams in the same polarization direction, and applies structural birefringence corresponding to the polarization direction to each sub-CGH.

Japanese Patent Laid-Open No. 2006-49902 selectively uses a desired polarization mode by adopting a polarization controller as a unit for controlling polarization modes applied to a sub-CGH.

Japanese Patent Laid-Open No. 2006-5319 discloses a technique which can control the balance among four poles of a quadrupolar light intensity distribution representatively formed by the modified illumination method and polarized illumination method. More specifically, Japanese Patent Laid-Open No. 2006-5319 forms sub-CGHs by dividing a CGH into four, and changes the intensity distribution of incident light, thereby making it possible to change the pole balance of a reconstructed image obtained by the CGH.

However, the prior arts form sub-CGHs by dividing one CGH into a plurality of CGHs, so an illuminance variation occurs in a reconstructed image if an optical integrator cannot sufficiently correct the intensity distribution of incident light (for example, if light enters only some of these CGHs).

When a plurality of sub-CGHs are combined, unnecessary diffracted light is generated due to structural discontinuity that occurs at the boundary between the sub-CGHs, resulting in deterioration in a reconstructed image obtained by the CGH. Structural discontinuity that occurs at the boundary between the sub-CGHs can be eliminated by improving the design of a computer generated hologram, but this poses another problem that the design cost increases enormously.

When polarization modes are selectively used by a polarization controller, the use efficiency (illumination efficiency) of light (exposure light) from an exposure light source decreases significantly (i.e., a loss in light amount increases).

SUMMARY OF THE INVENTION

The present invention provides a computer generated hologram which can suppress an illuminance variation and a loss in light amount, and form a light intensity distribution (reconstructed image) with a desired shape in a desired polarization state.

According to one aspect of the present invention, there is provided a computer generated hologram which forms a light intensity distribution on a predetermined plane by giving a phase distribution to a wavefront of incident light, comprising an anisotropic layer whose refractive index with respect to linearly polarized light in a first direction is different from a refractive index of the anisotropic layer with respect to linearly polarized light in a second direction perpendicular to the linearly polarized light in the first direction, and an isotropic layer whose refractive index with respect to the linearly polarized light in the first direction is equal to a refractive index of the isotropic layer with respect to the linearly polarized light in the second direction, wherein a first light intensity distribution formed on the predetermined plane by a linearly polarized light component in the first direction of the incident light is made different from a second light intensity distribution formed on the predetermined plane by a linearly polarized light component in the second direction of the incident light by giving different phase distributions to a wavefront of the linearly polarized light component in the first direction of the incident light, and a wavefront of the linearly polarized light component in the second direction of the incident light.

According to another aspect of the present invention, there is provided an exposure apparatus comprising an illumination optical system configured to illuminate a reticle with light from a light source, and a projection optical system configured to project a pattern of the reticle onto a substrate, wherein the illumination optical system includes the above computer generated hologram.

According to still another aspect of the present invention, there is provided a device fabrication method comprising steps of exposing a substrate using the above exposure apparatus, and performing a development process for the substrate exposed.

Further features of the present invention will become apparent from the following description of exemplary embodiments with reference to the attached drawings.

DESCRIPTION OF THE EMBODIMENTS

A preferred embodiment of the present invention will be described below with reference to the accompanying drawings. The same reference numerals denote the same members throughout the drawings, and a repetitive description thereof will not be given.

Figure 1:
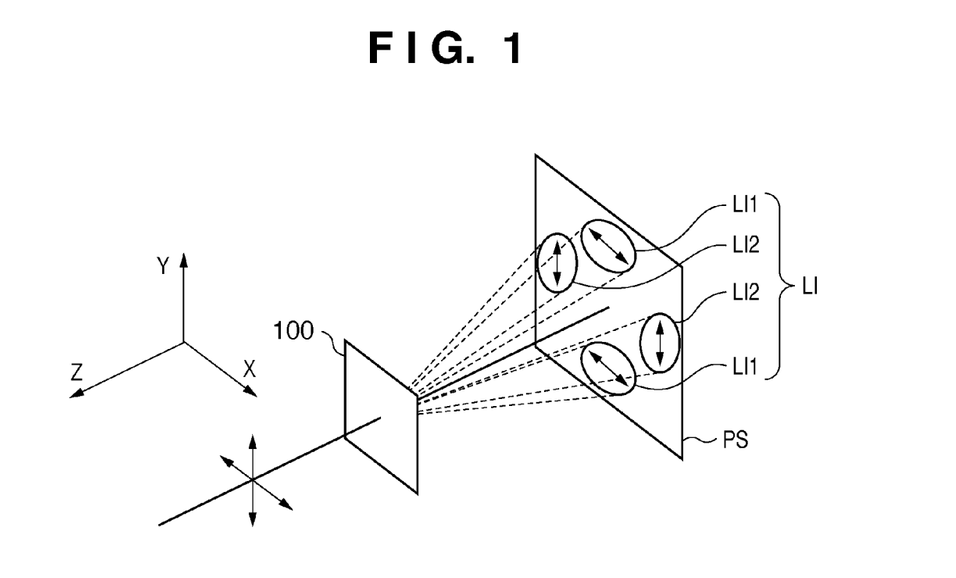
FIG. 1 is a view for explaining a computer generated hologram according to one aspect of the present invention.

FIG. 1 is a view for explaining a computer generated hologram 100 according to one aspect of the present invention. As shown in FIG. 1, the computer generated hologram 100 forms a light intensity distribution (reconstructed image) LI on a predetermined plane PS (e.g., at the aperture position) by giving a phase distribution to the wavefront of incident light. The computer generated hologram 100 gives different phase distributions to the wavefront of X-polarized light serving as linearly polarized light in a first direction (linearly polarized light whose polarization direction is the first direction), and that of Y-polarized light serving as linearly polarized light in a second direction (linearly polarized light whose polarization direction is the second direction). This makes it possible to make a first light intensity distribution $LI_1$ formed by X-polarized light (a linearly polarized light component in the first direction of incident light) different from a second light intensity distribution $LI_2$ formed by Y-polarized light (a linearly polarized light component in the second direction of the incident light). The linearly polarized light in the second direction is perpendicular to that in the first direction.

Figure 2A:
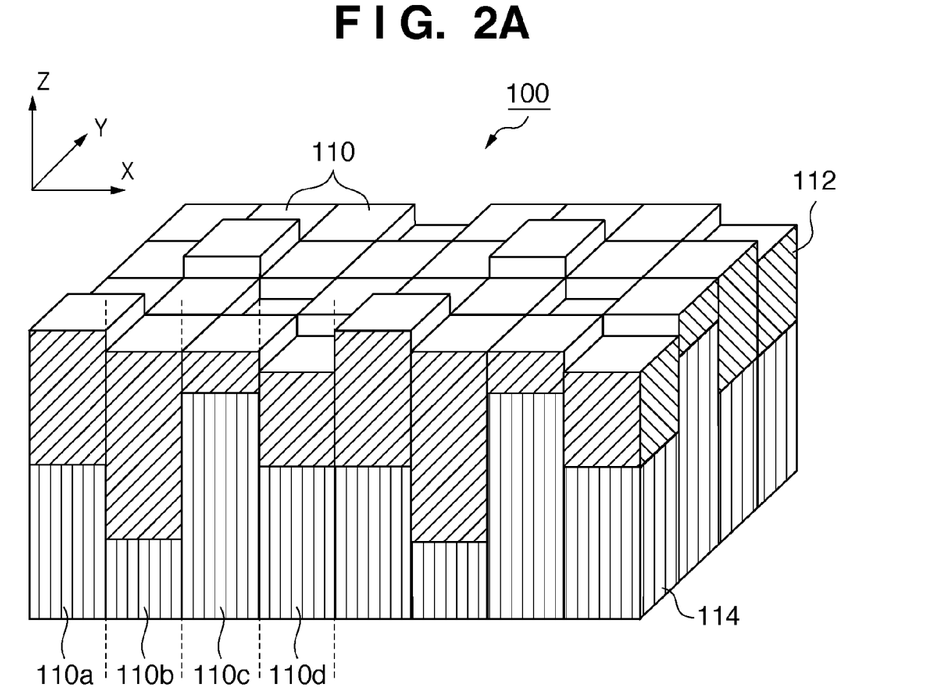
FIG. 2A is a schematic perspective view showing the arrangement of the computer generated hologram shown in FIG. 1.
Figure 2B:
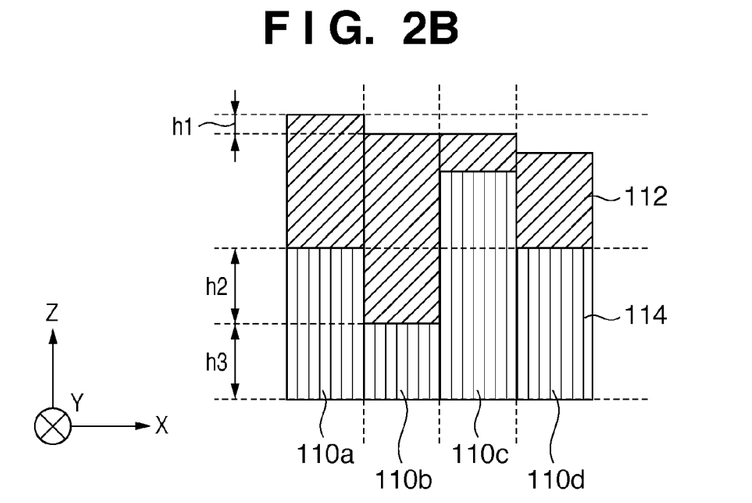
FIG. 2B is a schematic sectional view showing four cells of the computer generated hologram shown in FIG. 2A taken along the X-Z plane.

The computer generated hologram 100 which gives different phase distributions to the wavefronts of X-polarized light and Y-polarized light will be explained in detail below. FIG. 2A is a schematic perspective view showing the arrangement of the computer generated hologram 100. FIG. 2B is a schematic sectional view showing four cells 110a to 110d of the computer generated hologram 100 shown in FIG. 2A taken along the X-Z plane. As shown in FIG. 2A, the computer generated hologram 100 is formed by arraying a plurality of rectangular cells 110 in a tetragonal lattice pattern. As shown in FIG. 2B, each of the plurality of cells 110 includes an isotropic layer (isotropic medium) 112 whose refractive index with respect to X-polarized light is equal to that with respect to Y-polarized light, and an anisotropic layer (anisotropic medium) 114 whose refractive index with respect to X-polarized light is different from that with respect to Y-polarized light. In other words, each of the plurality of cells 110 is formed by stacking the isotropic layer 112 and anisotropic layer 114.

To give different phase distributions to the wavefronts of X-polarized light and Y-polarized light, the computer generated hologram 100 must independently control the wavefronts in the respective polarization directions. Considering that the computer generated hologram 100 is a two-step computer generated hologram in this embodiment, it is necessary to give binary phases to the wavefronts in the two polarization directions. For this purpose, the cells 110 of the computer generated hologram 100 must have cell structures of four types. Each of the cells 110a to 110d shown in FIG. 2B has a cell structure of one of these four types. The cell structure herein means the arrangement of the isotropic layer 112 and anisotropic layer 114 (the thicknesses of the isotropic layer 112 and anisotropic layer 114). Because the computer generated hologram 100 is formed by arraying the cells 110 having cell structures of these four types in a tetragonal lattice pattern, each of the isotropic layer 112 and anisotropic layer 114 is formed by multiple steps. In other words, each of the isotropic layer 112 and anisotropic layer 114 is formed by a plurality of partial regions having different thicknesses.

The step heights of the cells 110a to 110d in the Z direction can be expressed using a refractive index n of the isotropic layer 112, a refractive index $n_x$ of the anisotropic layer 114 with respect to X-polarized light, and a refractive index $n_y$ of the anisotropic layer 114 with respect to Y-polarized light. For the sake of simplicity, this embodiment will exemplify a case in which $n_x - n = n - n_y > 0$. To form the two-step computer generated hologram 100, a phase shift of π is necessary. To attain this state, a one-step height $h_1$ at the boundary between the atmosphere and the isotropic layer 112 need only satisfy:

$$h_1 = (1/4) \cdot (\lambda/(n-1)) \quad (2)$$

A one-step height $h_2$ at the boundary between the isotropic layer 112 and the anisotropic layer 114 need only satisfy:

$$h_2 = (1/4) \cdot (\lambda/(n_x - n)) = (1/4) \cdot (\lambda/(n - n_y)) \quad (3)$$

The isotropic layer 112 and anisotropic layer 114 are formed by multiple steps (a plurality of partial regions having different thicknesses) using these step heights $h_1$ and $h_2$, as shown in FIG. 2B.

Assuming the cell 110a as a reference, since the phase of X-polarized light which enters the cell 110b advances by $\pi/2$ due to a difference in boundary level between the atmosphere and the isotropic layer 112, and advances by $\pi/2$ due to a difference in boundary level between the isotropic layer 112 and the anisotropic layer 114, it advances by $\pi$ as a whole. Also, assuming the cell 110a as a reference, since the phase of Y-polarized light which enters the cell 110b advances by $\pi/2$ due to a difference in boundary level between the atmosphere and the isotropic layer 112, and delays by $\pi/2$ due to a difference in boundary level between the isotropic layer 112 and the anisotropic layer 114, it remains the same as the reference as a whole.

Assuming the cell 110a as a reference, since the phase of X-polarized light which enters the cell 110c advances by $\pi/2$ due to a difference in boundary level between the atmosphere and the isotropic layer 112, and delays by $\pi/2$ due to a difference in boundary level between the isotropic layer 112 and the anisotropic layer 114, it remains the same as the reference as a whole. Also, assuming the cell 110a as a reference, since the phase of Y-polarized light which enters the cell 110c advances by $\pi/2$ due to a difference in boundary level between the atmosphere and the isotropic layer 112, and advances by $\pi/2$ due to a difference in boundary level between the isotropic layer 112 and the anisotropic layer 114, it advances by $\pi$ as a whole.

Assuming the cell 110a as a reference, since the phase of X-polarized light which enters the cell 110d advances by $\pi$ due to a difference in boundary level (by two steps) between the atmosphere and the isotropic layer 112, and does not change due to a difference in boundary level between the isotropic layer 112 and the anisotropic layer 114, it advances by $\pi$ as a whole. Also, assuming the cell 110a as a reference, since the phase of Y-polarized light which enters the cell 110d advances by $\pi$ due to a difference in boundary level (by two steps) between the atmosphere and the isotropic layer 112, and does not change due to a difference in boundary level between the isotropic layer 112 and the anisotropic layer 114, it advances by $\pi$ as a whole.

When the first light intensity distribution $LI_1$ formed by X-polarized light does not interfere with the second light intensity distribution $LI_2$ formed by Y-polarized light on the predetermined plane PS (on the image plane), a thickness $h_3$ of a substrate of the anisotropic layer 114 may be arbitrary because there is no need to take account of the relative phase difference between the X-polarized light and the Y-polarized light. However, if the reference wavefronts of X-polarized light and Y-polarized light must be matched with each other by taking account of interference between the light intensity distributions $LI_1$ and $LI_2$, the thickness of the anisotropic layer 114 is set to the one which shifts the phase by $2\pi$, that is, to an integer multiple of $4 \times h_2$. This makes it possible to match the reference wavefronts of X-polarized light and Y-polarized light. The thickness $h_3$ of the substrate of the anisotropic layer 114 may be set to zero by selecting zero as an integer of the integer multiple.

Although the cells 110a to 110d having cell structures which shift the phase by $\pi$ between X-polarized light and Y-polarized light have been explained in this embodiment, the cells 110a to 110d may have cell structures which shift the phase by $(2n+1)\pi$ (i.e., $3\pi, 5\pi, \ldots$). In this case, the step heights $h_1$ and $h_2$ are multiplied by $(2n+1)$, i.e., 3, 5, ... in accordance with n.

Although this embodiment has been explained assuming that $n_x - n = n - n_y$, the values of the right-hand side and left-hand side need not always be equal to each other, and may be shifted in accordance with a degree of polarization and a precision of the light intensity distribution, which are required to form a reconstructed image.

Two-step computer generated holograms are independently designed for the light intensity distributions $LI_1$ and $LI_2$ formed by X-polarized light and Y-polarized light, and cell structures (cells 110a to 110d) obtained by superposing these computer generated holograms are selected appropriately. This makes it possible to form a computer generated hologram 100 which gives different phase distributions to the wavefronts of X-polarized light and Y-polarized light. As described above, four cell structures of the cells 110a to 110d are the one which serves as the reference of the wavefronts of X-polarized light and Y-polarized light, the one which advances only the wavefront of X-polarized light by $\pi$, the one which advances only the wavefront of Y-polarized light by $\pi$, and the one which advances the wavefronts of X-polarized light and Y-polarized light by $\pi$.

The computer generated hologram 100 can give different phase distributions to the wavefronts of X-polarized light and Y-polarized light over the entire surface of the computer generated hologram in the respective polarization directions without dividing the entire surface of a computer generated hologram into a plurality of regions (sub-CGHs), unlike the prior arts. Hence, even when an optical integrator cannot sufficiently correct the light intensity distribution of incident light, the computer generated hologram 100 never suffers any illuminance variation in light intensity distribution (reconstructed image).

Since the computer generated hologram 100 has a structure in which the pattern of the cells 110a to 110d is repeated, it does not use a plurality of different sub-CGHs. Hence, the computer generated hologram 100 never suffers any deterioration in light intensity distribution due to unnecessary diffracted light attributed to structural discontinuity that occurs at the boundary between the sub-CGHs. Likewise, since the computer generated hologram 100 does not use sub-CGHs, a design to eliminate structural discontinuity that occurs at the boundary between the sub-CGHs is also unnecessary, which allows reduction of design cost.

The computer generated hologram 100 can give different phase distributions to the wavefronts of X-polarized light and Y-polarized light without selecting the polarization direction of incident light. Hence, the computer generated hologram 100 can form a light intensity distribution (reconstructed image) almost without generating any loss in light amount. In other words, the computer generated hologram 100 can form a light intensity distribution with a desired shape in a desired polarization state while satisfactorily reducing a loss in light amount.

In this manner, the computer generated hologram 100 can give different phase distributions to the wavefronts of polarized light components in the first and second directions of incident light by forming the anisotropic layer 114 by multiple steps and setting the thickness of the anisotropic layer 114 for each of the plurality of cells.

Figure 3:
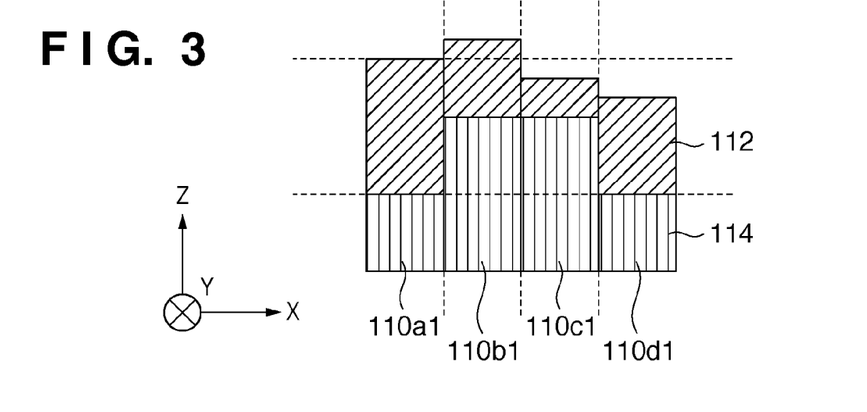
FIG. 3 is a schematic sectional view showing four cells of the computer generated hologram shown in FIG. 2A taken along the X-Z plane.

In the computer generated hologram 100, multiple steps of the anisotropic layer 114 may be fewer than those of the isotropic layer 112. In other words, the number of thicknesses of the anisotropic layer 114 may be smaller than that of the isotropic layer 112. In this case, the computer generated hologram 100 is formed by a plurality of cells 110a1 to 110d1 each including an isotropic layer 112 and anisotropic layer 114, as shown in FIG. 3. The refractive index of the isotropic layer 112, the refractive index of the anisotropic layer 114, and the step heights of these cells in the Z direction are as above. Note that FIG. 3 is a schematic sectional view showing the four cells 110a1 to 110d1 of the computer generated hologram 100 shown in FIG. 2A taken along the X-Z plane.

The computer generated hologram 100 performs phase control by either matching the phase with a reference or shifting the phase by $\pi$ from the reference, as described above. Although a method of advancing the phase by $\pi$ is selected as a method of shifting the phase by $\pi$ in the above description, the same effect can be obtained even by selecting a method of delaying the phase by $\pi$. The cell 110b1 shown in FIG. 3 has a cell structure when the method of delaying the phase by $\pi$ is selected.

Assuming the cell 110a1 as a reference, since the phase of X-polarized light which enters the cell 110b1 delays by $\pi/2$ due to a difference in boundary level between the atmosphere and the isotropic layer 112, and delays by $\pi/2$ due to a difference in boundary level between the isotropic layer 112 and the anisotropic layer 114, it delays by $\pi$ as a whole. Also, assuming the cell 110a1 as a reference, the phase of Y-polarized light which enters the cell 110b1 delays by $\pi/2$ due to a difference in boundary level between the atmosphere and the isotropic layer 112, and advances by $\pi/2$ due to a difference in boundary level between the isotropic layer 112 and the anisotropic layer 114, it remains the same as the reference as a whole.

The cell 110b described above has a function of advancing only the phase of X-polarized light by $\pi$, while the cell 110b1 has a function of delaying only the phase of X-polarized light by $\pi$. The cells 110b and 110b1 have equivalent functions in terms of shifting only the phase of X-polarized light by $\pi$ from a reference. The cells 110a1, 110c1, and 110d1 have cell structures identical to those of the cells 110a, 110c, and 110d, respectively. Therefore, the four cell structures of the cells 110a1 to 110d1 shown in FIG. 3 have equivalent functions as those of the cells 110a to 110d shown in FIG. 2B.

In the computer generated hologram 100 including the cell 110b1 with a cell structure which delays the phase by $\pi$, the three-step structure of the anisotropic layer 114 shown in FIG. 2B is substituted by a two-step structure as shown in FIG. 3. In addition, the three-step structure at the boundary between the atmosphere and the isotropic layer 112 shown in FIG. 2B is substituted by a four-step structure as shown in FIG. 3. Selecting not only a phase advancing method but also a phase delaying method in phase control makes it possible to form a structure in which multiple steps of the anisotropic layer 114 are fewer than those of the isotropic layer 112.

The refractive index difference between the isotropic layer 112 and the anisotropic layer 114 is generally smaller than that between the atmosphere and the isotropic layer 112. For this reason, the one-step height at the boundary between the isotropic layer 112 and the anisotropic layer 114 is higher than that at the boundary between the atmosphere and the isotropic layer 112. In view of this, the amount of engraving in manufacturing the computer generated hologram 100 can be decreased by forming fewer steps at the boundary between the isotropic layer 112 and the anisotropic layer 114 than those at the boundary between the atmosphere and the isotropic layer 112. This makes it possible to easily manufacture the computer generated hologram 100.

A general computer generated hologram is designed on the assumption that it is an infinitely thin element. Consequently, an actual computer generated hologram exhibits a function different from that expected based on a design value by the amount of engraving. As is obvious from FIGS. 2B and 3, the computer generated hologram 100 having the cells 110a1 to 110d1 shown in FIG. 3 can be manufactured to be thinner than that having the cells 110a to 110d shown in FIG. 2B. Hence, a light intensity distribution closer to a desired one can be obtained by decreasing the amount of engraving.

For example, to manufacture a computer generated hologram having a structure with steps in a number equal to the nth power of 2 using an exposure apparatus, it is necessary to perform exposure n times by changing the amount of engraving. In view of this, a computer generated hologram can be manufactured most effectively when the number of steps of the computer generated hologram is the nth power of 2.

When the number of steps at the boundary between the anisotropic layer 114 and the isotropic layer 112 is three, and that at the boundary between the atmosphere and the isotropic layer 112 is three (FIG. 2B), exposure must be performed twice at the boundary between the anisotropic layer 114 and the isotropic layer 112, and exposure must be performed twice at the boundary between the atmosphere and the isotropic layer 112. Therefore, exposure must be performed four times in total to manufacture such a computer generated hologram.

When the number of steps at the boundary between the anisotropic layer 114 and the isotropic layer 112 is two, and that at the boundary between the atmosphere and the isotropic layer 112 is four (FIG. 3), exposure must be performed once at the boundary between the anisotropic layer 114 and the isotropic layer 112, and exposure must be performed twice at the boundary between the atmosphere and the isotropic layer 112. Therefore, exposure must be performed three times in total to manufacture such a computer generated hologram. In this manner, alignment errors can be reduced by decreasing the number of times of exposure required to manufacture a computer generated hologram. This makes it possible to manufacture a computer generated hologram closer to that which matches a design value.

Although this embodiment has exemplified a case in which multiple steps of the anisotropic layer 114 are fewer than those of the isotropic layer 112, multiple steps of the isotropic layer 112 can be fewer than those of the anisotropic layer 114. At present, a refractive index difference $\Delta n$ of the anisotropic layer 114 with respect to two polarization directions is smaller than that between the atmosphere and the isotropic layer 112. However, the latter scheme becomes valid when an anisotropic layer 114 having a very large refractive index difference $\Delta n$ is developed or discovered.

Figure 4:
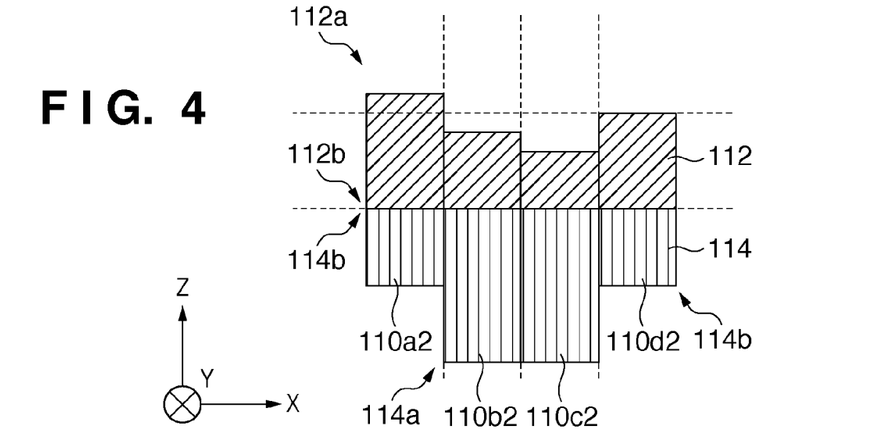
FIG. 4 is a schematic sectional view showing four cells of the computer generated hologram shown in FIG. 2A taken along the X-Z plane.

In a plurality of cells 110a2 to 110d2 of the computer generated hologram 100, an isotropic layer 112 and anisotropic layer 114 are preferably bonded along a plane, as shown in FIG. 4. Referring to FIG. 4, the isotropic layer 112 has a three-dimensional surface 112a and flat surface 112b, and the anisotropic layer 114 similarly has a three-dimensional surface 114a and flat surface 114b. The arrangement positions of the isotropic layer 112 and anisotropic layer 114 in the Z direction in the cell structure of each of the plurality of cells 110a2 to 110d2 shown in FIG. 4 are relatively different from those in the cell structure of each of the plurality of cells 110a1 to 110d1 shown in FIG. 3. However, the thicknesses of the isotropic layer 112 and anisotropic layer 114 in the cell structure of each of the plurality of cells 110a2 to 110d2 shown in FIG. 4 are equal to those in the cell structure of each of the plurality of cells 110a1 to 110d1 shown in FIG. 3. Therefore, the computer generated hologram 100 formed by the plurality of cells 110a2 to 110d2 shown in FIG. 4 has the same function as that formed by the plurality of cells 110a1 to 110d1 shown in FIG. 3. Note that FIG. 4 is a schematic sectional view showing the four cells 110a2 to 110d2 of the computer generated hologram 100 shown in FIG. 2A taken along the X-Z plane.

It is generally, very difficult to manufacture the computer generated hologram 100 formed by the plurality of cells 110a1 to 110d1 shown in FIG. 3 by bonding the three-dimensional surface of the isotropic layer 112 and that of the anisotropic layer 114. It is also difficult to fill an engraved three-dimensional substrate surface with a medium (isotropic medium or anisotropic medium) without leaving any space in the substrate. To solve this problem, the flat surface 112b of the isotropic layer 112 and the flat surface 114b of the anisotropic layer 114 are bonded to oppose each other, as shown in FIG. 4. In other words, the isotropic layer 112 and anisotropic layer 114 are bonded along a plane. This makes it possible to easily manufacture the computer generated hologram 100 formed by the plurality of cells 110a2 to 110d2 shown in FIG. 4. In manufacturing the computer generated hologram 100 (the plurality of cells 110a2 to 110d2), the isotropic layer 112 and anisotropic layer 114 may be bonded after engraving, or they may be engraved after bonding.

The material of the anisotropic layer 114 will be explained herein. In this embodiment, the anisotropic layer 114 is formed from a birefringence material whose refractive index changes depending on the polarization direction due to its crystal nature. Detailed examples of the birefringence material of the anisotropic layer 114 are crystal, magnesium fluoride, and calcite. Because the traveling speed of light depends on the refractive index of a medium, forming the anisotropic layer 114 from a birefringence material makes it possible to shift the wavefront of linearly polarized light whose polarization direction is the first direction, and that of linearly polarized light whose polarization direction is the second direction.

For example, consider a case in which the anisotropic layer 114 is formed from calcite. The composition of calcite is calcium carbonate ($CaCO_3$), which has a refractive index of 1.6584 and 1.4864 with respect to a wavelength of 589 nm. From $n_x - n = n - n_y$, a material having a refractive index $n = (n_x - n_y)/2 = (1.6584 - 1.4864)/2 = 1.5724$ is selected as the material of the isotropic layer 112. There are a variety of materials which meet this condition and, for example, S-BAL11 which has a refractive index of 1.5725 and is available from OHARA can be selected as the material of the isotropic layer 112. This embodiment merely exemplifies the materials of the isotropic layer 112 and anisotropic layer 114, and they may be formed from any materials as long as their refractive indices meet the above-described condition.

The birefringence material of the anisotropic layer 114 includes a material having intrinsic birefringence. Fluorite (calcium fluoride) has a cubic crystal structure by nature and therefore is not a birefringence material, but its refractive index slightly changes depending on the crystal axis. More specifically, fluoride calcium has an intrinsic birefringence of about 3.4 nm/cm with respect to the wavefront. It is therefore possible to form the anisotropic layer 114 using fluoride calcium as the material by positively utilizing such intrinsic birefringence.

In the plurality of cells 110 of the computer generated hologram 100, the anisotropic layer 114 may have a three-dimensional structure which generates structural birefringence. Note that the three-dimensional structure herein means that each cell internally has a three-dimensional structure, differently from the multiple-step structure of the anisotropic layer 114.

For example, Japanese Patent Laid-Open No. 2006-196715 discloses a three-dimensional structure which is made of quartz and generates structural birefringence. Japanese Patent Laid-Open No. 2006-196715 describes that quartz has a refractive index of 1.56 with respect to a wavelength of 193 nm, and a diffraction grating in a structural birefringence region has a refractive index $n\perp$ of 1.19 in the pitch direction, and has a refractive index $nII$ of 1.31 in a direction perpendicular to the pitch direction, assuming that its duty ratio is 1:1 (=0.5).

Letting $n_y$ and $n_x$ be the refractive index $n\perp$ in the pitch direction and the refractive index $nII$ in a direction perpendicular to the pitch direction in Japanese Patent Laid-Open No. 2006-196715, and assuming that the wavelength is 193 nm, a step height $h_2$ is about 804 nm from expression (3). This value is about four times the wavelength, which is a practical thickness for a computer generated hologram.

The refractive indices $nII$ and $n\perp$ can be calculated by:

$$n_{II} = \sqrt{\frac{a}{P}n_1^2 + \left(1 - \frac{a}{p}\right)n_2^2} \qquad (4)$$

$$n_\perp = \frac{1}{\sqrt{\frac{a/p}{n_1^2} + \frac{(1-a/p)}{n_2^2}}}$$

where a/P is filling factor.

Referring to expressions (4), the use of a plurality of filling factors allows attaining various refractive index differences $\Delta n = n_{II} - n_\perp$. Until now, the phase difference between the wavefronts of X-polarized light and Y-polarized light is controlled by setting the thickness of the anisotropic layer 114 for each cell. However, even when the thickness of the anisotropic layer 114 is the same between all cells, the phase difference between the wavefronts of X-polarized light and Y-polarized light can be controlled by setting the filling factor of the anisotropic layer 114 for each cell. When quartz is used as the birefringence material, the refractive index difference $\Delta n$ can be selected from a wide range of 0 to 0.122 at a wavelength of 193 nm.

Note that the control of the refractive index difference $\Delta n$ changes the refractive indices $nII$ and $n\perp$. This amounts to a shift in reference wavefront, but this shift can be canceled by controlling the thickness of the isotropic layer 112.

In this manner, different phase distributions can be given to the wavefronts of polarized light components in the first and second directions of incident light by setting the refractive index of the anisotropic layer 114 for each of the plurality of cells of the computer generated hologram 100.

It is also possible to form the plurality of cells 110 (computer generated hologram 100) using both a method of setting the thickness of the anisotropic layer 114 for each of the plurality of cells, and a method of setting the refractive index (filling factor) of the anisotropic layer 114 for each of the plurality of cells. This makes it possible to more flexibly design the computer generated hologram 100 and to more easily manufacture the computer generated hologram 100.

Figure 5:
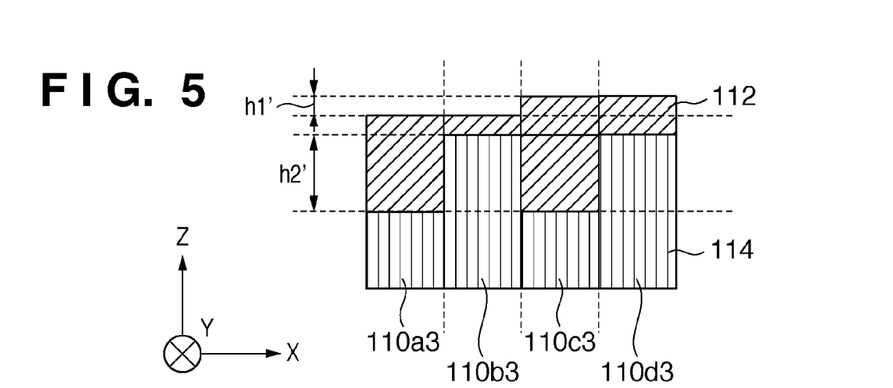
FIG. 5 is a schematic sectional view showing four cells of the computer generated hologram shown in FIG. 2A taken along the X-Z plane.

The reason why the refractive index of the anisotropic layer 114 with respect to linearly polarized light in the first or second direction may be equal to that of the isotropic layer 112 will be explained with reference to FIG. 5. FIG. 5 is a schematic sectional view showing four cells 110a3 to 110d3 of the computer generated hologram 100 shown in FIG. 2A taken along the X-Z plane.

FIG. 5 exemplifies a case in which the cell structure of each of the plurality of cells 110a3 to 110d3 satisfies $n=n_x>n_y$, where n is the refractive index of the isotropic layer 112, $n_x$ is the refractive index of the anisotropic layer 114 with respect to X-polarized light, and $n_y$ is the refractive index of the anisotropic layer 114 with respect to Y-polarized light. To form the two-step computer generated hologram 100, a phase shift of π is necessary. To attain this state, a step height $h_1'$ at the boundary between the atmosphere and the isotropic layer 112 need only satisfy:

$$h_1'=(1/2)\cdot(\lambda/(n-1)) \tag{5}$$

A step height $h_2'$ at the boundary between the isotropic layer 112 and the anisotropic layer 114 need only satisfy:

$$h_2'=(1/2)\cdot(\lambda/(n_x-n))=(1/2)\cdot(\lambda/(n-n_y)) \tag{6}$$

Assuming the cell 110a3 as a reference, the phase of X-polarized light which enters the cell 110b3 remains the same as the reference. Also, assuming the cell 110a3 as a reference, the phase of Y-polarized light which enters the cell 110b3 advances by π.

Assuming the cell 110a3 as a reference, the phase of X-polarized light which enters the cell 110c3 delays by π. Also, assuming the cell 110a3 as a reference, the phase of Y-polarized light which enters the cell 110d3 delays by π.

Assuming the cell 110a3 as a reference, since the phase of X-polarized light which enters the cell 110d3 delays by π in the isotropic layer 112, and does not change in the anisotropic layer 114, it delays by π as a whole. Also, assuming the cell 110a3 as a reference, since the phase of Y-polarized light which enters the cell 110d3 delays by π in the isotropic layer 112, and advances by π in the anisotropic layer 114, it remains the same as the reference as a whole.

Although the cells 110a3 to 110d3 having cell structures which shift the phase by π between X-polarized light and Y-polarized light have been explained in this embodiment, the cells 110a3 to 110d3 may have cell structures which shift the phase by (2n+1)π (i.e., 3π, 5π, . . . .) In this case, the step heights $h_1'$ and $h_2'$ are multiplied by (2n+1), i.e., 3, 5, . . . in accordance with n.

In this manner, when the refractive index of the anisotropic layer 114 with respect to linearly polarized light in one direction is equal to that of the isotropic layer 112 ($n=n_x>n_y$), the cells 110a3 to 110d3 can be formed to have simple cell structures with multiple steps fewer than those of the cell structures shown in FIGS. 2B, 3, and 4. More specifically, a two-step computer generated hologram for the wavefronts of X-polarized light and Y-polarized light can be attained by forming two steps at the boundary between the anisotropic layer 114 and the isotropic layer 112, and two steps at the boundary between the atmosphere and the isotropic layer 112. Although this embodiment has been explained assuming that $n=n_x>n_y$, the cells 110a3 to 110d3 can be formed to have similar cell structures even when $n_x>n_y=n$.

A simple example of the design of the computer generated hologram 100 which forms different light intensity distributions $LI_1$ and $LI_2$ for X-polarized light and Y-polarized light will be explained herein with reference to FIGS. 6A to 6F. FIGS. 6A to 6F are views for explaining an example of the design of the computer generated hologram 100 which forms different light intensity distributions $LI_1$ and $LI_2$ for X-polarized light and Y-polarized light.

Figure 6A:
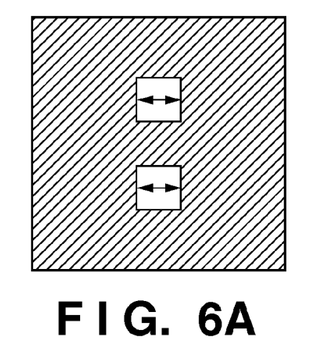
FIGS. 6A to 6F are views for explaining an example of the design of a computer generated hologram according to one aspect of the present invention.
Figure 6B:
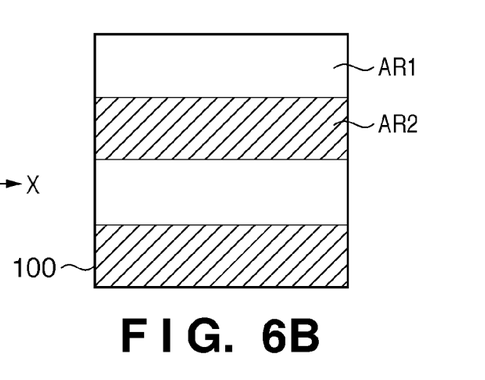

FIG. 6A shows, for example, a light intensity distribution (target image) formed by X-polarized light, and each two-headed arrow indicates the polarization direction. FIG. 6B shows a computer generated hologram 100 in which two basic patterns of a computer generated hologram for forming the light intensity distribution shown in FIG. 6A are juxtaposed horizontally. In practice, the computer generated hologram 100 has a periodic structure, in which an infinite number of basic patterns of the computer generated hologram shown in FIG. 6B are arrayed horizontally. Reference symbols AR1 and AR2 indicate the thicknesses of cells of the computer generated hologram 100. The thickness AR2 shifts the phase by π assuming the thickness AR1 as a reference. A light intensity distribution in the polarization state shown in FIG. 6A can be formed by irradiating the computer generated hologram 100 shown in FIG. 6B with X-polarized light.

Figure 6C:
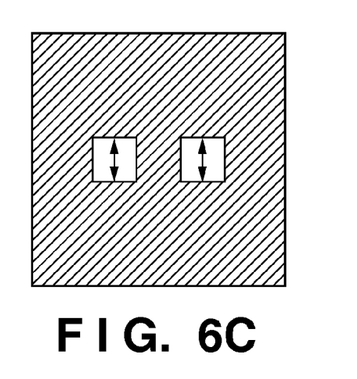
Figure 6D:
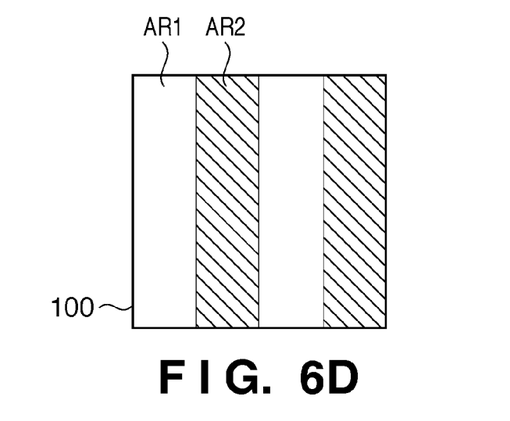

FIG. 6C shows, for example, a light intensity distribution (target image) formed by Y-polarized light, and each two-headed arrow indicates the polarization direction. As in FIG. 6B, FIG. 6D shows a computer generated hologram 100 in which two basic patterns of a computer generated hologram for forming the light intensity distribution shown in FIG. 6C are juxtaposed vertically. A light intensity distribution in the polarization state shown in FIG. 6D can be formed by irradiating the computer generated hologram 100 shown in FIG. 6D with Y-polarized light.

Figure 6E:
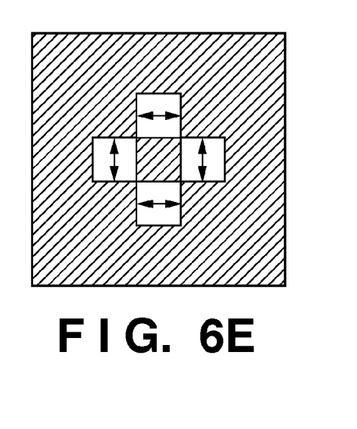
Figure 6F:
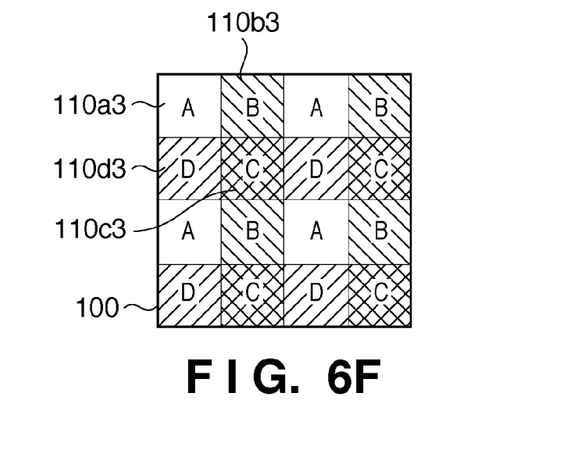

FIG. 6E shows a light intensity distribution obtained by superposing those shown in FIGS. 6A and 6C. A computer generated hologram 100 which forms the light intensity distribution shown in FIG. 6E is formed by combining those shown in FIGS. 6B and 6D, and has a plurality of cells with four cell structures, as described above. A to D shown in FIG. 6F indicate four cell structures and, more specifically, correspond to the cell structures of the cells 110a3 to 110d3 shown in FIG. 5. A light intensity distribution in the polarization state shown in FIG. 6E can be formed by irradiating the computer generated hologram 100 shown in FIG. 6F with X-polarized light and Y-polarized light.

A very simple example of the design of the computer generated hologram 100 has been explained in this embodiment. However, it is possible to similarly design a computer generated hologram 100 which forms a more complicated light intensity distribution with a desired shape in a desired polarization state. More specifically, computer generated holograms corresponding to light intensity distributions formed by X-polarized light and Y-polarized light are designed independently, these two computer generated holograms are superposed on each other, and a cell structure corresponding to each cell is selected.

Figure 7:
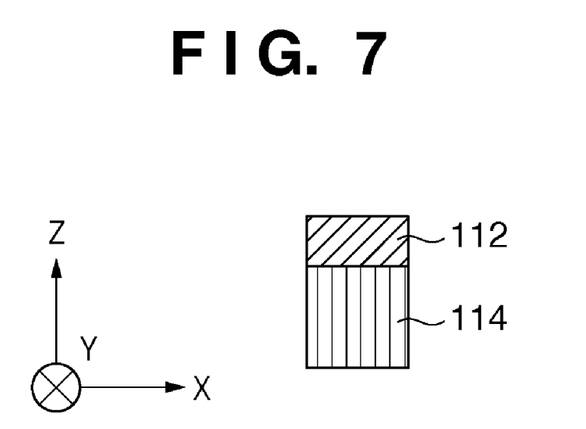
FIG. 7 is a view for explaining a computer generated hologram having more than two steps.

A computer generated hologram 100 having more than two steps will be explained with reference to FIG. 7. FIG. 7 is a view for explaining a computer generated hologram 100 having more than two steps.

To give different phase distributions to the wavefronts of X-polarized light and Y-polarized light, it is necessary to arbitrarily give a phase difference between the wavefronts of X-polarized light and Y-polarized light, and to arbitrarily give those between the wavefronts of X-polarized light and Y-polarized light given a phase difference and their reference wavefronts.

Referring to FIG. 7, a phase difference can be arbitrarily given between the wavefronts of X-polarized light and Y-polarized light by changing the thickness of the anisotropic layer 114 in the Z direction. Likewise, phase differences can be arbitrarily given between the wavefronts of X-polarized light and Y-polarized light given a phase difference and their reference wavefronts by changing the thickness of the isotropic layer 112 in the Z direction.

Different phase differences of more than two types can be given between the wavefronts of X-polarized light and Y-polarized light by giving a multi-step phase difference between the wavefronts of X-polarized light and Y-polarized light, and giving those between the wavefronts of X-polarized light and Y-polarized light given a phase difference and their reference wavefronts. This makes it possible to form a computer generated hologram 100 having more than two steps. It is also possible to continuously change the phase difference between the wavefronts of X-polarized light and Y-polarized light, and those between the wavefronts of X-polarized light and Y-polarized light given a phase difference and their reference wavefronts by continuously changing the thicknesses of the isotropic layer 112 and anisotropic layer 114.

This embodiment has used a limitation $n_x - n = n - n_y > 0$ or $n = n_x > n_y$ for the sake of descriptive simplicity. However, the refractive indices $n_x$, $n_y$, and n can be arbitrarily selected when the same effect as in this embodiment are obtained by forming steps of the isotropic layer 112 and anisotropic layer 114.

An example of a method of manufacturing a computer generated hologram 100 will be explained herein. This is a method of manufacturing a computer generated hologram 100 in which the thicknesses of an isotropic layer 112 and anisotropic layer 114 are set for each cell, and a three-dimensional structure generates structural birefringence.

First, the isotropic layer 112 or anisotropic layer 114 of the computer generated hologram 100 is uniformly coated with a photosensitive resin (photoresist) using a coating apparatus.

Next, the pattern of a predetermined computer generated hologram is transferred onto the photoresist using an exposure apparatus, and then the photoresist is developed using a developing apparatus, thereby forming a periodic three-dimensional grating pattern on the photoresist.

Lastly, dry etching is performed using a reactive ion etching apparatus and the periodic three-dimensional grating pattern as an etching mask to form a groove with a predetermined depth. After that, the photoresist is removed by ashing using a solvent or gas.

The computer generated hologram 100 described above can be manufactured by these processes. The method of manufacturing the computer generated hologram 100 explained in this embodiment is merely an example, and other micropatterning techniques such as nanoimprinting may be used as long as a desired computer generated hologram 100 can be formed.

Figure 8:
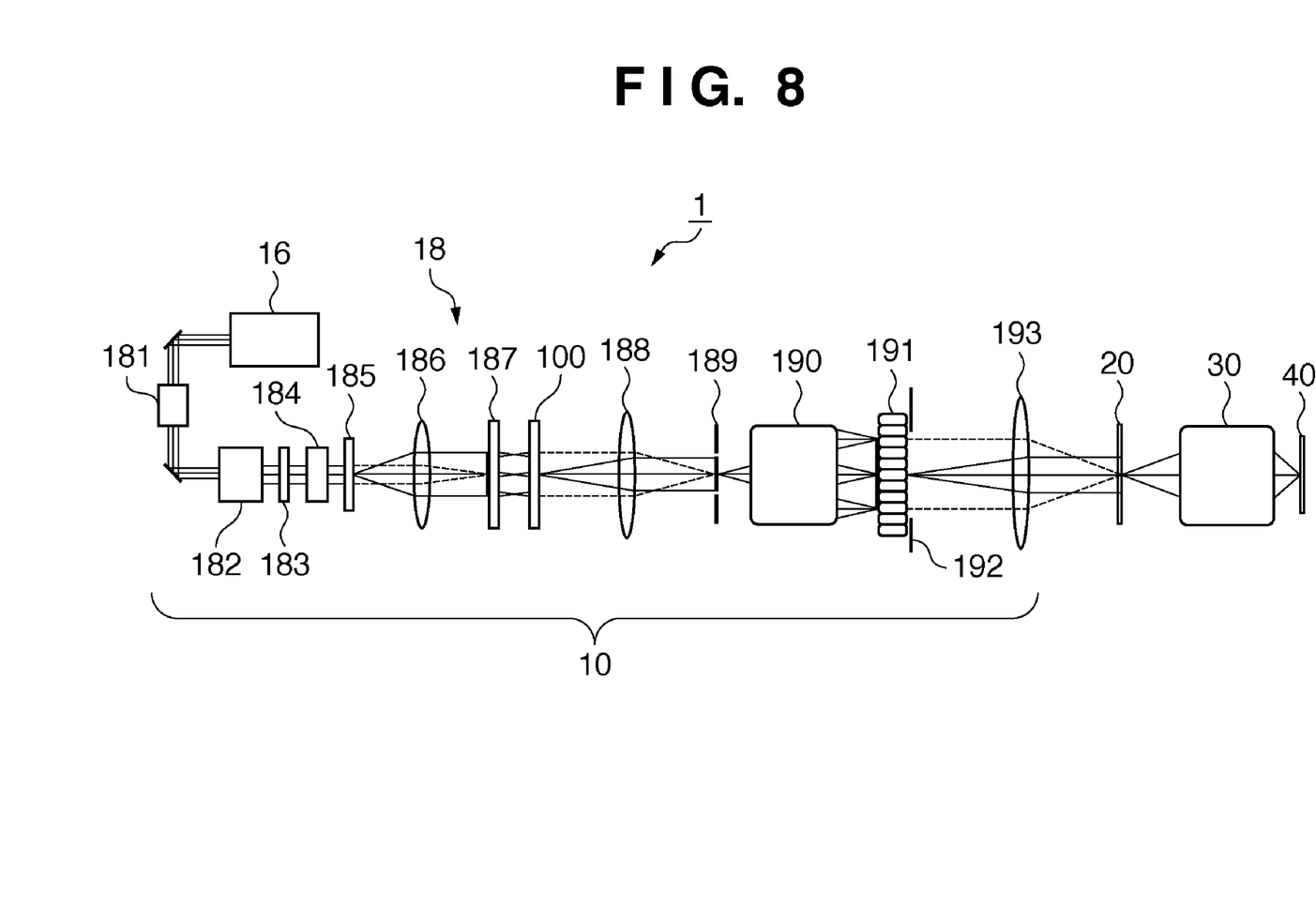
FIG. 8 is a view showing an exposure apparatus according to one aspect of the present invention.

An exposure apparatus 1 to which the computer generated hologram 100 according to the present invention is applied will be explained below with reference to FIG. 8. FIG. 8 is a view showing the arrangement of the exposure apparatus 1 according to one aspect of the present invention.

In this embodiment, the exposure apparatus 1 is a projection exposure apparatus which transfers the pattern of a reticle 20 onto a wafer 40 by the step & scan scheme. However, the exposure apparatus 1 can adopt the step & repeat scheme or another exposure scheme.

As shown in FIG. 8, the exposure apparatus 1 includes an illumination apparatus 10, a reticle stage (not shown) for supporting the reticle 20, a projection optical system 30, and a wafer stage (not shown) for supporting the wafer 40.

The illumination apparatus 10 illuminates the reticle 20 on which a circuit pattern to be transferred is formed, and includes a light source 16 and illumination optical system 18.

The light source 16 is, for example, an excimer laser such as an ArF excimer laser with a wavelength of about 193 nm or a KrF excimer laser with a wavelength of about 248 nm. However, the light source 16 is not particularly limited to an excimer laser, and may be, for example, an $F_2$ laser with a wavelength of about 157 nm.

The illumination optical system 18 illuminates the reticle 20 with light from the light source 16, and performs modified illumination on the reticle 20 in a predetermined polarization state while ensuring a predetermined illuminance in this embodiment. In this embodiment, the illumination optical system 18 includes a light extension optical system 181, beam shaping optical system 182, polarization controller 183, phase controller 184, exit angle saving optical element 185, relay optical system 186, multibeam generation unit 187, and computer generated hologram 100. The illumination optical system 18 also includes a relay optical system 188, aperture 189, zoom optical system 190, multibeam generation unit 191, aperture stop 192, and irradiation unit 193.

The light extension optical system 181 deflects light from the light source 16 to guide it to the beam shaping optical system 182. The beam shaping optical system 182 shapes the section of the light from the light source 16 into a desired shape by converting the horizontal to vertical ratio of the section of the light from the light source 16 into a desired value (e.g., by changing the sectional shape from a rectangle to a square). The beam shaping optical system 182 forms a light beam with a size and an angle of divergence which are required to illuminate the multibeam generation unit 187.

The polarization controller 183 includes, for example, a linear polarizer and has a function of removing unnecessary polarized light components. It is possible to efficiently convert the light from the light source 16 into desired linearly polarized light by minimizing polarized light components removed (shielded) by the polarization controller 183.

The phase controller 184 converts the linearly polarized light obtained by the polarization controller 183 into circularly polarized light by giving a phase difference of $\lambda/4$ to it.

The exit angle saving optical element 185 includes, for example, an optical integrator (e.g., a fly-eye lens or fiber bundle including a plurality of microlenses), and makes the light emerge at a predetermined angle of divergence.

The relay optical system 186 converges the light which emerges from the exit angle saving optical element 185 on the multibeam generation unit 187. The relay optical system 186 adjusts the exit surface of the exit angle saving optical element 185 and the incident surface of the multibeam generation unit 187 to have the Fourier transform relationship (the relationship between the object plane and the pupil plane or that between the pupil plane and the image plane).

The multibeam generation unit 187 includes an optical integrator (e.g., a fly-eye lens or fiber bundle including a plurality of microlenses) for uniformly illuminating the computer generated hologram 100. The exit surface of the multibeam generation unit 187 forms a light source surface including a plurality of point light sources. The light which emerges from the multibeam generation unit 187 enters the computer generated hologram 100 as circularly polarized light.

The computer generated hologram 100 forms light intensity distributions LI (light intensity distributions $LI_1$ and $LI_2$ formed by X-polarized light and Y-polarized light) at the position of the aperture 189 via the relay optical system 188. The computer generated hologram 100 can take any of the above-described forms, and a detailed description thereof will not be given herein.

Figure 9:
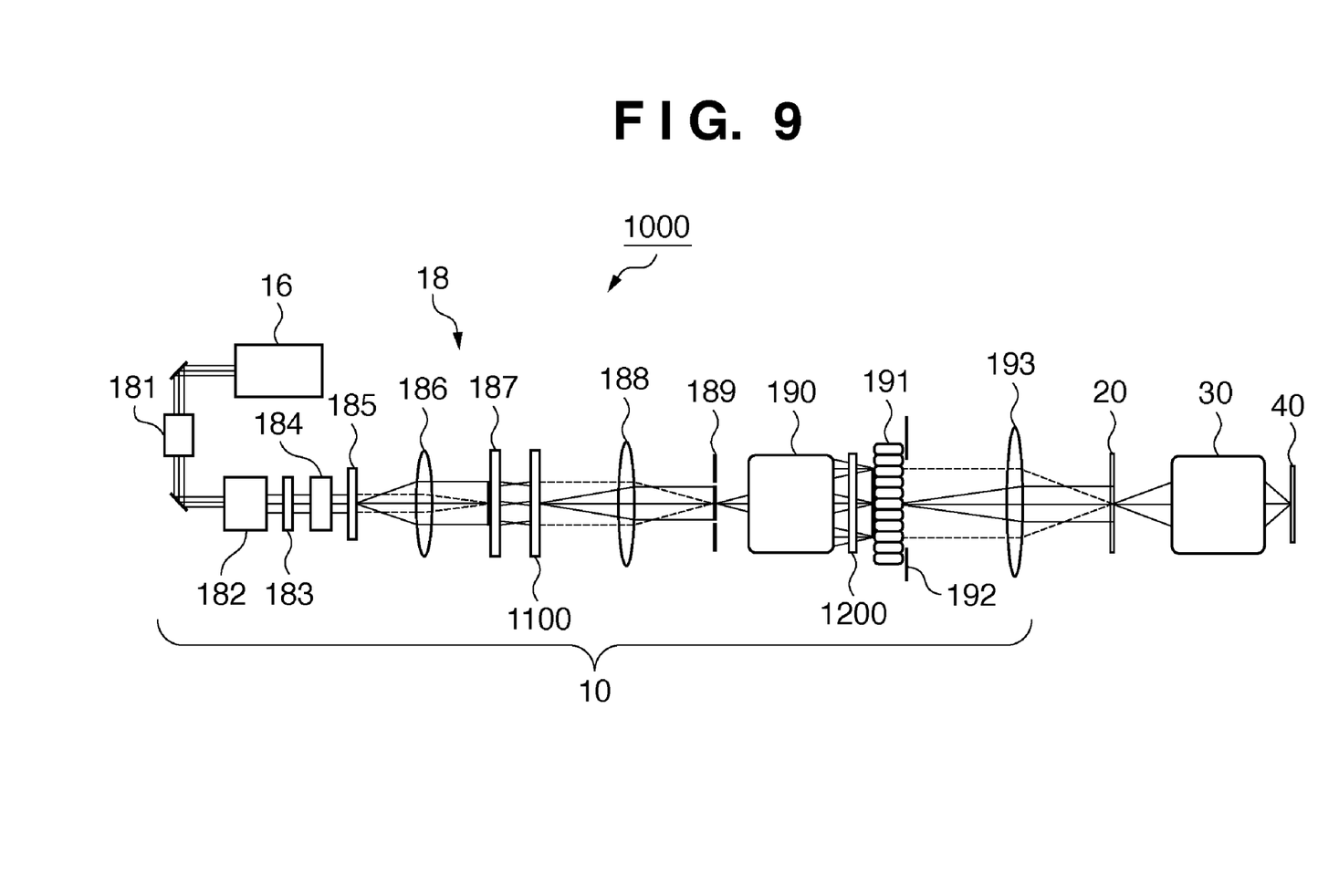
FIG. 9 is a view showing a conventional exposure apparatus.

An exposure apparatus 1000 using a conventional computer generated hologram 1100 cannot independently control X-polarized light and Y-polarized light as shown in FIG. 9, so a $\lambda/4$ plate 1200 must be inserted between the zoom optical system 190 and the multibeam generation unit 191. When a light intensity distribution formed by the computer generated hologram 1100 is divided for each polarization direction, the $\lambda/4$ plate 1200 can be inserted immediately before or immediately after the computer generated hologram 1100. Note that FIG. 9 is a view showing the arrangement of the conventional exposure apparatus 1000.

In contrast, since the exposure apparatus 1 according to this embodiment uses the computer generated hologram 100 which can independently control light intensity distributions formed by X-polarized light and Y-polarized light, the λ/4 plate 1200 is unnecessary. Applying the computer generated hologram 100 to an exposure apparatus makes it possible to form the exposure apparatus 1 and illumination optical system 18 more simply than in the prior arts.

The aperture 189 has a function of passing only a light intensity distribution formed by the computer generated hologram 100. The computer generated hologram 100 and aperture 189 are set to have the Fourier transform relationship.

The zoom optical system 190 enlarges a light intensity distribution formed by the computer generated hologram 100 at a predetermined magnification, and projects it onto the multibeam generation unit 191.

The multibeam generation unit 191 is inserted on the pupil plane of the illumination optical system 18, and forms, on its exit surface, a light source image (effective light source distribution) corresponding to the light intensity distribution formed at the position of the aperture 189. In this embodiment, the multibeam generation unit 191 includes an optical integrator such as a fly-eye lens or cylindrical lens array. The aperture stop 192 is inserted near the exit surface of the multibeam generation unit 191.

The irradiation unit 193 includes, for example, a condenser optical system and illuminates the reticle 20 with an effective light source distribution formed on the exit surface of the multibeam generation unit 191.

The reticle 20 has a circuit pattern and is supported and driven by the reticle stage (not shown). Diffracted light generated by the reticle 20 is projected onto the wafer 40 via the projection optical system 30. Since the exposure apparatus 1 is of the step & scan scheme, it transfers the pattern of the reticle 20 onto the wafer 40 by scanning them.

The projection optical system 30 projects the pattern of the reticle 20 onto the wafer 40. The projection optical system 30 can be a dioptric system, catadioptric system, or catoptric system.

The wafer 40 is a substrate onto which the pattern of the reticle 20 is projected (transferred), and is supported and driven by the wafer stage (not shown). However, it is also possible to use a glass plate or another substrate in place of the wafer 40. The wafer 40 is coated with a resist.

Although light which enters the computer generated hologram 100 is circularly polarized in the exposure apparatus 1 according to this embodiment, it may be non-polarized. More specifically, a depolarizer for converting light from the light source 16 into non-polarized light is set to guide non-polarized light which emerges from the depolarizer to the computer generated hologram 100. Japanese Patent Laid-Open No. 2004-198348, for example, discloses a depolarizer. It is possible to guide non-polarized light to the computer generated hologram 100 using the depolarizer in place of the phase controller 184.

Figure 10:
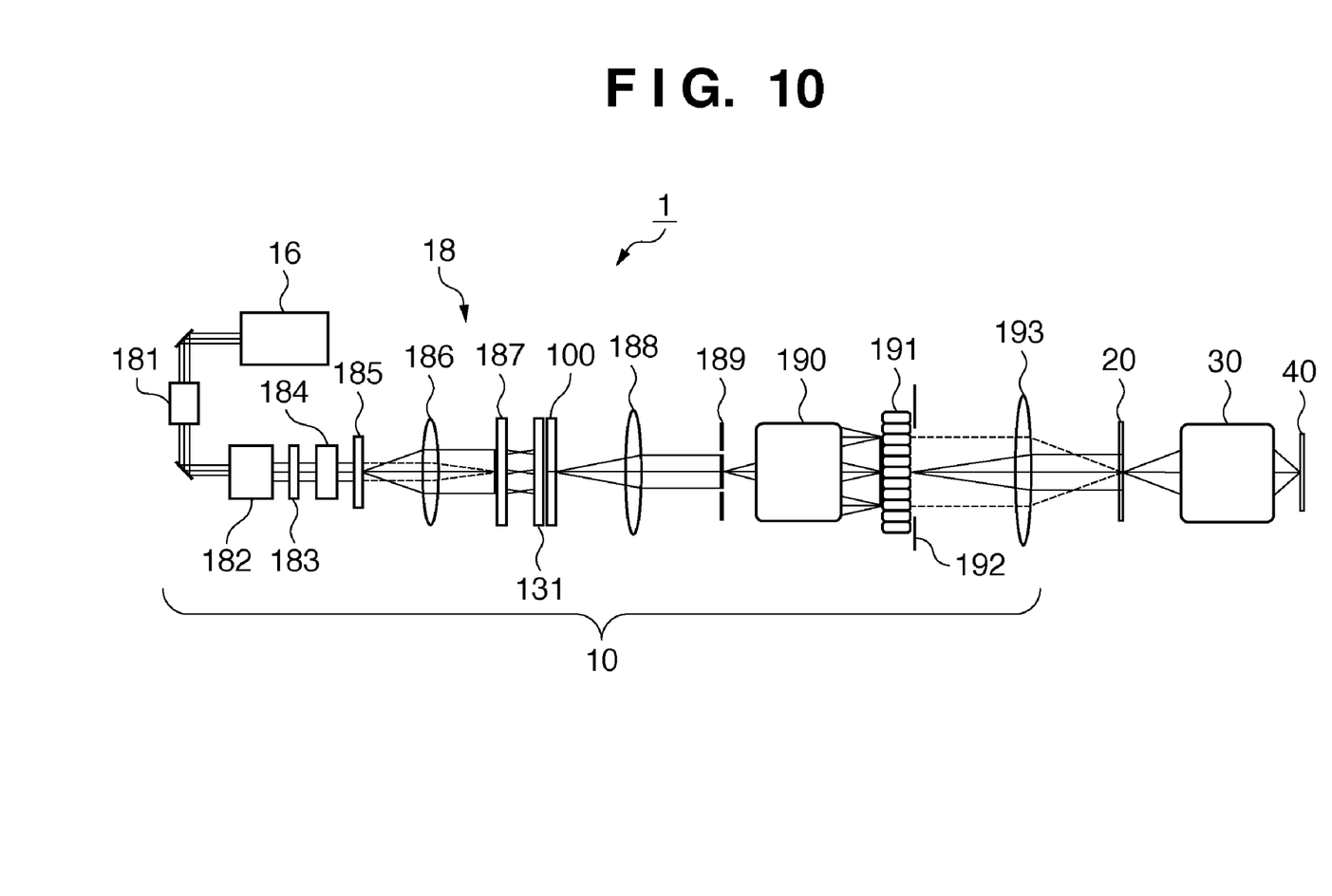
FIG. 10 is a view showing an exposure apparatus according to one aspect of the present invention.

The exposure apparatus 1 may includes a λ/4 plate 194 serving as a polarization state adjusting unit which adjusts the polarization state of light which enters the computer generated hologram 100, as shown in FIG. 10. Note that FIG. 10 is a view showing the arrangement of the exposure apparatus 1 according to one aspect of the present invention.

The λ/4 plate 194 serving as a polarization state adjusting unit adjusts the intensity ratio between linearly polarized light components in the first and second directions of light which enters the computer generated hologram 100. This makes it possible to adjust the ratio between the light intensities of a first light intensity distribution $LI_1$ and second light intensity distribution $LI_2$ formed by the computer generated hologram 100. Although a case in which circularly polarized light or non-polarized light enters the computer generated hologram 100 has been exemplified above, linearly polarized light can enter the computer generated hologram 100. Adjusting the angle of linearly polarized light which enters the computer generated hologram 100 makes it possible to change the intensity ratio between X-polarized light and Y-polarized light.

Figure 11:
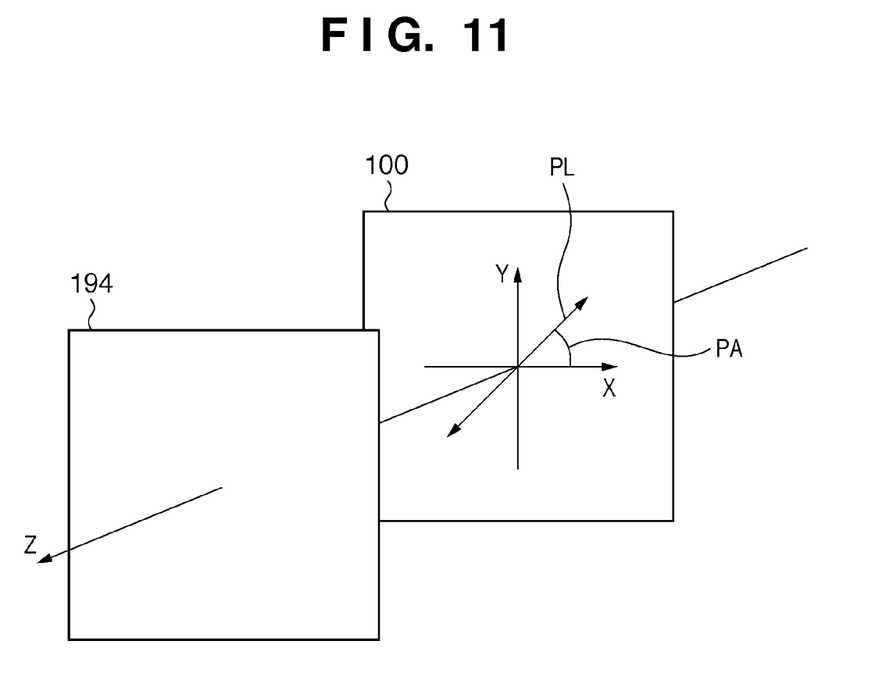
FIG. 11 is a schematic perspective view showing the vicinity of a computer generated hologram and λ/4 plate in the exposure apparatus shown in FIG. 10.

As shown in FIG. 11, the λ/4 plate 194 serving as a polarization state adjusting unit is inserted immediately before the computer generated hologram 100. Rotating the λ/4 plate 194 along the optical axis (Z-axis) makes it possible to obtain a desired direction of linearly polarized light PL with respect to the computer generated hologram 100. The linear polarization direction is indicated by an angle PA. Note that FIG. 11 is a schematic perspective view showing the vicinity of the computer generated hologram 100 and λ/4 plate 194.

Changing the angle PA makes it possible to change the intensity ratio between X-polarized light and Y-polarized light. If, for example, the angle PA is 0°, X-polarized light alone enters the computer generated hologram 100, and therefore the light intensity distribution $LI_1$ alone is formed. If the angle PA is 90°, Y-polarized light alone enters the computer generated hologram 100, and therefore the light intensity distribution $LI_2$ alone is formed. If the angle PA is 45°, light intensity distributions $LI_1$ and $LI_2$ with the same intensity ratio between X-polarized light and Y-polarized light as in circularly polarized light or non-polarized light, that is, an intensity ratio of 1:1 are formed.

The exposure apparatus 1 must change the balance between X-polarized light and Y-polarized light in accordance with a circuit pattern transferred onto the wafer 40. When the computer generated hologram 100 forms the quadrupolar light intensity distribution LI as shown in FIG. 1, the balance (pole balance) between the light intensity distributions $LI_1$ and $LI_2$ can be preferably changed by setting the λ/4 plate 194.

As described above, the computer generated hologram 100 gives different phase distributions to the wavefronts of X-polarized light and Y-polarized light not along one polarization direction but along all polarization directions. This makes it possible to form the light intensity distribution LI almost without generating any loss in light amount. Even when the polarization direction of light which enters the computer generated hologram 100 is changed, the overall energy of the light intensity distribution LI remains the same. Consequently, when desired energy of the light intensity distribution (reconstructed image) LI is specified, incident light energy can be determined without taking account of the angle PA.

In exposure, light emitted by the light source 16 illuminates the reticle 20 by the illumination optical system 18. A light component reflecting the pattern of the reticle 20 forms an image on the wafer 40 by the projection optical system 30. The illumination optical system 18 used for the exposure apparatus 1 can suppress any illumination variation and loss in light amount, and form a light intensity distribution with a desired shape in a desired polarization state by the computer generated hologram 100. Hence, the exposure apparatus 1 can provide devices (e.g., a semiconductor device, an LCD device, an image sensing device (e.g., a CCD), and a thin-film magnetic head) with high throughput, high quality, and a good economical efficiency. These devices are fabricated by a step of exposing a substrate (e.g., a wafer or glass plate)

coated with a photoresist (photosensitive agent) using the exposure apparatus 1, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-199904 filed on Jul. 31, 2007, which is hereby incorporated by reference herein in its entirety.

What is claimed is:

1. A computer generated hologram which forms a light intensity distribution on a predetermined plane by giving a phase distribution to a wavefront of incident light, comprising
an anisotropic layer whose refractive index with respect to linearly polarized light in a first polarization direction is different from a refractive index of the anisotropic layer with respect to linearly polarized light in a second polarization direction perpendicular to the first polarization direction, and
an isotropic layer whose refractive index with respect to the linearly polarized light in the first direction is equal to a refractive index of the isotropic layer with respect to the linearly polarized light in the second direction,
wherein a first light intensity distribution formed on the predetermined plane by a linearly polarized light component in the first polarization direction of the incident light is made different from a second light intensity distribution formed on the predetermined plane by a linearly polarized light component in the second polarization direction of the incident light by giving different phase distributions to a wavefront of the linearly polarized light component in the first polarization direction of the incident light, and a wavefront of the linearly polarized light component in the second polarization direction of the incident light,
wherein the computer generated hologram includes a plurality of cells, and a thickness of the anisotropic layer and a thickness of the isotropic layer are set for each of the plurality of cells, and
wherein the number of thicknesses of the anisotropic layer is smaller than the number of thicknesses of the isotropic layer in the plurality of cells.

2. The hologram according to claim 1, wherein the different phase distributions are given to the wavefront of the linearly polarized light component in the first polarization direction of the incident light, and the wavefront of the linearly polarized light component in the second polarization direction of the incident light by setting a refractive index of the anisotropic layer for each of a plurality of cells.

3. The hologram according to claim 1, wherein a bonded plane between the anisotropic layer and the isotropic layer is a flat plane.

4. The hologram according to claim 1, wherein a refractive index of the anisotropic layer with respect to the linearly polarized light in one of the first polarization direction and the second polarization direction is equal to a refractive index of the isotropic layer.

5. The hologram according to claim 1, wherein the anisotropic layer is made of a birefringence material.

6. The hologram according to claim 5, wherein the birefringence material has intrinsic birefringence.

7. The hologram according to claim 1, wherein the anisotropic layer has a three-dimensional structure which generates structural birefringence.

8. An exposure apparatus comprising:
an illumination optical system configured to illuminate a reticle with light from a light source; and
a projection optical system configured to project a pattern of the reticle onto a substrate,
wherein the illumination optical system includes a computer generated hologram according to claim 1.

9. The apparatus according to claim 8, wherein the illumination optical system includes an optical element configured to convert the light which enters the computer generated hologram into non-polarized light.

10. The apparatus according to claim 8, wherein
the illumination optical system includes a polarization state adjusting unit configured to adjust a polarization state of the light which enters the computer generated hologram, and
the polarization state adjusting unit adjusts an intensity ratio between the linearly polarized light component in the first polarization direction and the linearly polarized light component in the second polarization direction of the light which enters the computer generated hologram, thereby adjusting a ratio between light intensities of the first light intensity distribution and the second light intensity distribution.

11. A device fabrication method comprising steps of:
exposing a substrate using an exposure apparatus according to claim 8; and
performing a development process for the substrate exposed.

12. The hologram according to claim 1, wherein
the plurality of cells include a first cell, a second cell, a third cell and a fourth cell,
the first cell and fourth cell do not shift a phase between the linearly polarized light component in the first polarization direction and the linearly polarized light component in the second polarization direction,
the second cell and the third cell shift a phase by u between the linearly polarized light component in the first polarization direction and the linearly polarized light component in the second polarization direction,
the thickness of the anisotropic layer in the first cell is equal to the thickness of the anisotropic layer in the fourth cell,
the thickness of the isotropic layer in the first cell is different from the thickness of the isotropic layer in the fourth cell,
the thickness of the anisotropic layer in the second cell is different from the thickness of the anisotropic layer in the third cell, and
the thickness of the isotropic layer in the second cell is different from the thickness of the isotropic layer in the third cell.

13. The hologram according to claim 1, wherein
the plurality of cells include a first cell, a second cell, a third cell and a fourth cell,
the first cell and the fourth cell do not shift a phase between the linearly polarized light component in the first polarization direction and the linearly polarized light component in the second polarization direction,
the second cell and the third cell shift a phase by u between the linearly polarized light component in the first polarization direction and the linearly polarized light component in the second polarization direction,
the thickness of the anisotropic layer in the first cell is equal to the thickness of the anisotropic layer in the fourth cell, the thickness of the isotropic layer in the first cell is different from the thickness of the isotropic layer in the fourth cell, the thickness of the anisotropic layer in the second cell is equal to the thickness of the anisotropic layer in the third cell, and the thickness of the isotropic layer in the second cell is different from the thickness of the isotropic layer in the third cell.

\* \* \* \* \*